(12) United States Patent
Moon

(10) Patent No.: US 7,820,345 B2
(45) Date of Patent: Oct. 26, 2010

(54) EXPOSURE MASK AND A METHOD OF MAKING A SEMICONDUCTOR DEVICE USING THE MASK

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 225 days.

(21) Appl. No.: 12/147,791

(22) Filed: Jun. 27, 2008

(65) Prior Publication Data

US 2009/0233183 A1    Sep. 17, 2009

(30) Foreign Application Priority Data

Mar. 11, 2008    (KR) .................. 10-2008-0022618

(51) Int. Cl.
*G03F 1/00*    (2006.01)
(52) U.S. Cl. .......................... 430/5; 430/311
(58) Field of Classification Search ............ 430/5, 430/311–313; 716/19
See application file for complete search history.

(56) References Cited

U.S. PATENT DOCUMENTS

2002/0045106 A1 * 4/2002 Baselmans et al. ............ 430/5
2004/0131950 A1   7/2004 Butt et al. ................... 430/5
2006/0199084 A1 * 9/2006 Word ........................... 430/5
2006/0269848 A1 * 11/2006 Setta ........................... 430/5
2009/0142674 A1 * 6/2009 Moon .......................... 430/5

FOREIGN PATENT DOCUMENTS

KR    10-2000-0075841    12/2000
KR    10-2007-0112032    11/2007

OTHER PUBLICATIONS

Notice of Rejection for Korean Patent Application No. 10-2008-0022618, dated Jun. 23, 2009.

* cited by examiner

*Primary Examiner*—Mark F Huff
*Assistant Examiner*—Stewart A Fraser
(74) *Attorney, Agent, or Firm*—Marshall, Gerstein & Borun LLP

(57) ABSTRACT

Disclosed herein are an exposure mask and a method of making a semiconductor device using the mask. The exposure mask includes a transparent substrate; and a light blocking pattern having first and second patterns, and an assist feature disposed between the first and second patterns and including a dot pattern arranged into two rows deviated from each other. The exposure make can improve the depth of focus margin to allow for the high integration of a semiconductor device.

9 Claims, 6 Drawing Sheets

EXPOSURE MASK AND A METHOD OF MAKING A SEMICONDUCTOR DEVICE USING THE MASK

CROSS-REFERENCE TO RELATED APPLICATION

The priority of Korean patent application No. 10-2008-0022618, filed on Mar. 11, 2008, the disclosure of which is incorporated by reference in its entirety, is claimed.

BACKGROUND OF THE INVENTION

1. Field of the Disclosure

The invention relates to an exposure mask for manufacturing a semiconductor device and a method of manufacturing a semiconductor device using the same, and more particularly, to an exposure mask capable of increasing depth of focus (DOF) margin of the semiconductor device.

2. Brief Description of Related Technology

As semiconductor devices or integrated circuit devices have become more highly integrated, much research has been devoted to the development of resolution enhancement technology. Resolution enhancement technology can improve the property of a semiconductor device and secure a process margin.

Asymmetry illumination is an example of a resolution improving technology that is introduced into the exposure process. Dipole illumination, for example, can allow the circuit diagram to be implemented in more detail.

In manufacturing a semiconductor device a gate pattern or a wire pattern is formed by performing a photolithography process, in which a photoresist layer is exposed to light using a patterned exposure mask as a mask. The exposure mask is made by forming a light blocking pattern, typically made from Cr, on a transparent substrate, for example, quartz.

In a memory semiconductor device, for example, the device's memory capacity has been largely increased and the critical dimension (CD) of pattern forming the device has been decreased.

Referring to FIG. 1, as a result of a reduction of the size of the gate, a slight change of the focus during the exposure process can cause a the gate to collapse (collapse phenomenon).

Conventionally, an Optical Proximity Correction (OPC) is performed to prevent the collapse phenomenon. Alternatively, an assist feature, as shown in FIGS. 2 and 3, can be used to prevent the collapse phenomenon. The assist feature, however, can be transferred to the semiconductor substrate in the process, causing a more serious problem to occur. The assist feature is formed on the exposure mask to form a main pattern having a desired size. The assist feature is implemented with the size which is not transferred to the semiconductor substrate.

The assist feature does not sufficiently prevent the collapse phenomenon for the change of focus that is required for highly integrated semiconductor devices.

FIG. 2 and FIG. 3 shows the exposure mask of the related art is on one side. A simulation of a pattern to be formed by transferring the exposure mask onto the semiconductor substrate is shown in the other side. The exposure mask is formed by forming an assist feature between gates or between the patterns neighboring the gate. A bar type assist feature is shown in FIG. 2. FIG. 3 shows a dot type assist feature.

The above-described exposure mask and the method of manufacturing a semiconductor device using the same makes higher integration of semiconductor devices difficult because the assist feature does not sufficiently improve the DOF margin.

BRIEF SUMMARY OF THE INVENTION

Embodiments of the invention are directed to providing an exposure mask and a method of manufacturing a semiconductor device using the same, which is capable of improving the depth of focus margin to allow for higher integration of a semiconductor device.

According to an embodiment of the invention, an exposure mask includes a transparent substrate; and a light blocking pattern having first and second patterns and an assist feature. The assist feature includes dot patterns that are arranged into two rows that are deviated from each other. The first and second patterns can be formed, for example, as one of a line pattern or an island pattern. For example, the first and second patterns can both be a line pattern or can both be an island pattern. Alternatively, for example, the first pattern can be a line pattern and the second pattern can be an island pattern, or the first pattern can be an island pattern and the second pattern can be a line pattern. The exposure mask can be, for example, a binary mask or a phase shifting mask.

According to an embodiment of the invention, a method of manufacturing of a semiconductor device includes providing an exposure mask comprising a transparent substrate and a light blocking pattern having first and second patterns and an assist feature disposed between the first and second patterns and formed from a dot pattern arranged in two row deviated from each other; forming an underlying layer at the upper portion of a semiconductor substrate; forming a photoresist pattern at the upper portion of the underlying layer using the exposure mask and etching the underlying layer using the photoresist pattern as a mask. The method can further include providing an exposure mask that is either a binary mask or a phase shifting mask. The method can further include forming a photoresist pattern using asymmetry illumination. For example, the asymmetry illumination can be a dipole illumination, a quadrupole illumination, a cross pole illumination, or a quasar process. The method can further include removing the photoresist pattern.

In an embodiment of the invention, the method can further include, for example, providing an exposure mask wherein the first pattern is a line pattern and the second pattern is an island pattern. In another embodiment of the invention, the first pattern can be, for example, an island pattern, and the second pattern can be, for example, a line pattern. In still another embodiment of the invention, the first and second patterns can both be formed, for example, of a line pattern or an island pattern.

BRIEF DESCRIPTION OF THE DRAWINGS

For a more complete understanding of the disclosure, reference should be made to the following detailed description and accompanying drawings.

Figure 1:
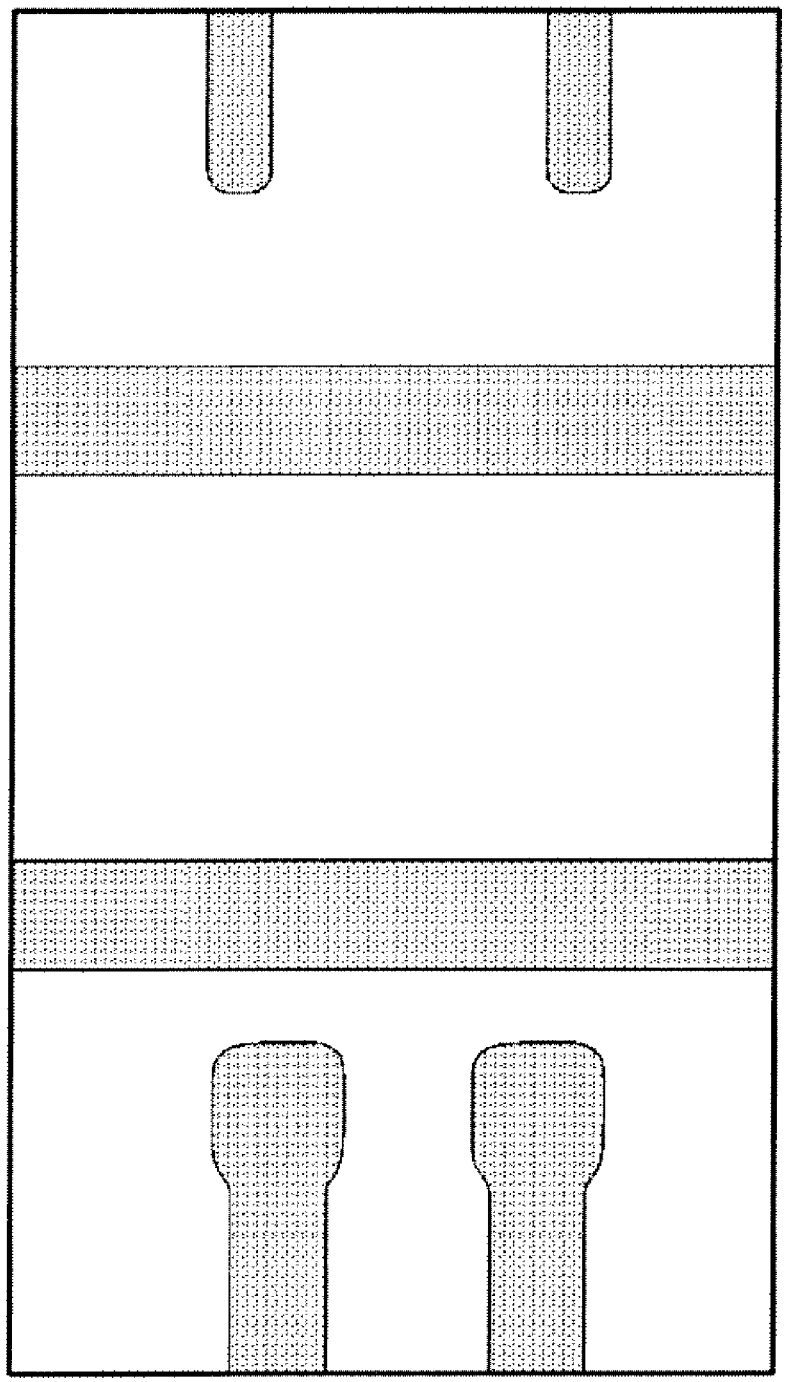
FIG. 1 is a drawing showing the problems of the related art.
Figure 2:
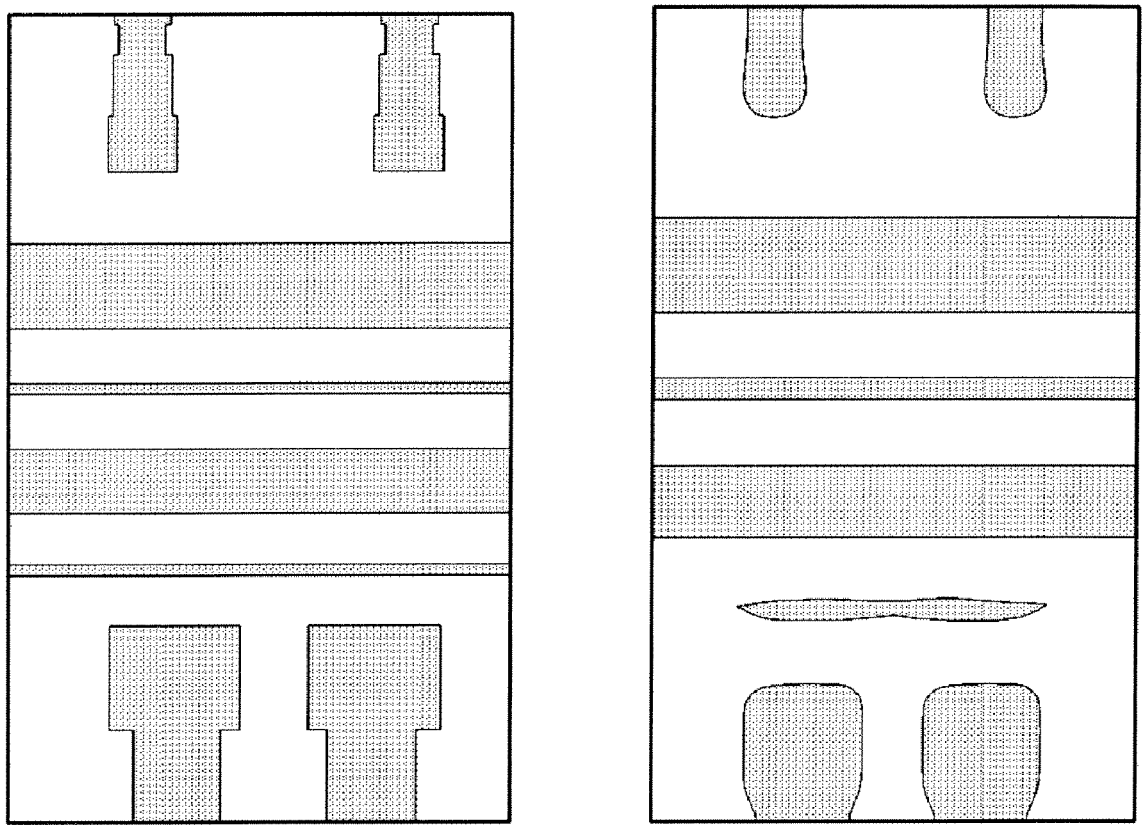
FIG. 2 is a drawing showing a conventional bar type assist feature, and the assist feature after it is transferred onto the semiconductor substrate.
Figure 3:
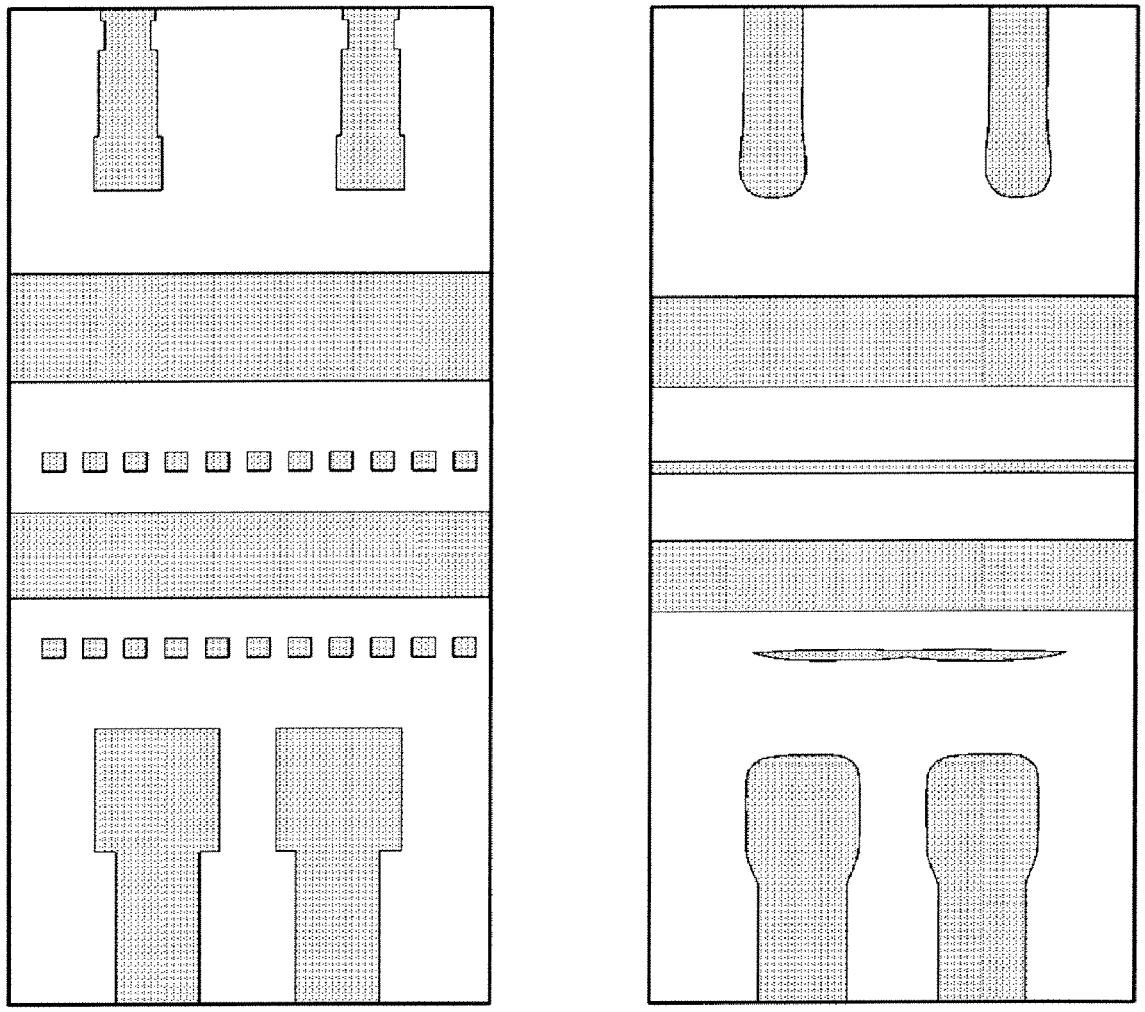
FIG. 3 is a drawing showing a conventional dot type assist feature, and the assist feature after it is transferred onto the semiconductor substrate.

While the disclosed mask and method are susceptible of embodiments in various forms, specific embodiments are illustrated in the drawings (and will hereafter be described), with the understanding that the disclosure is intended to be illustrative, and is not intended to limit the invention to the specific embodiments described and illustrated herein.

DETAILED DESCRIPTION OF EMBODIMENTS

Figure 4:
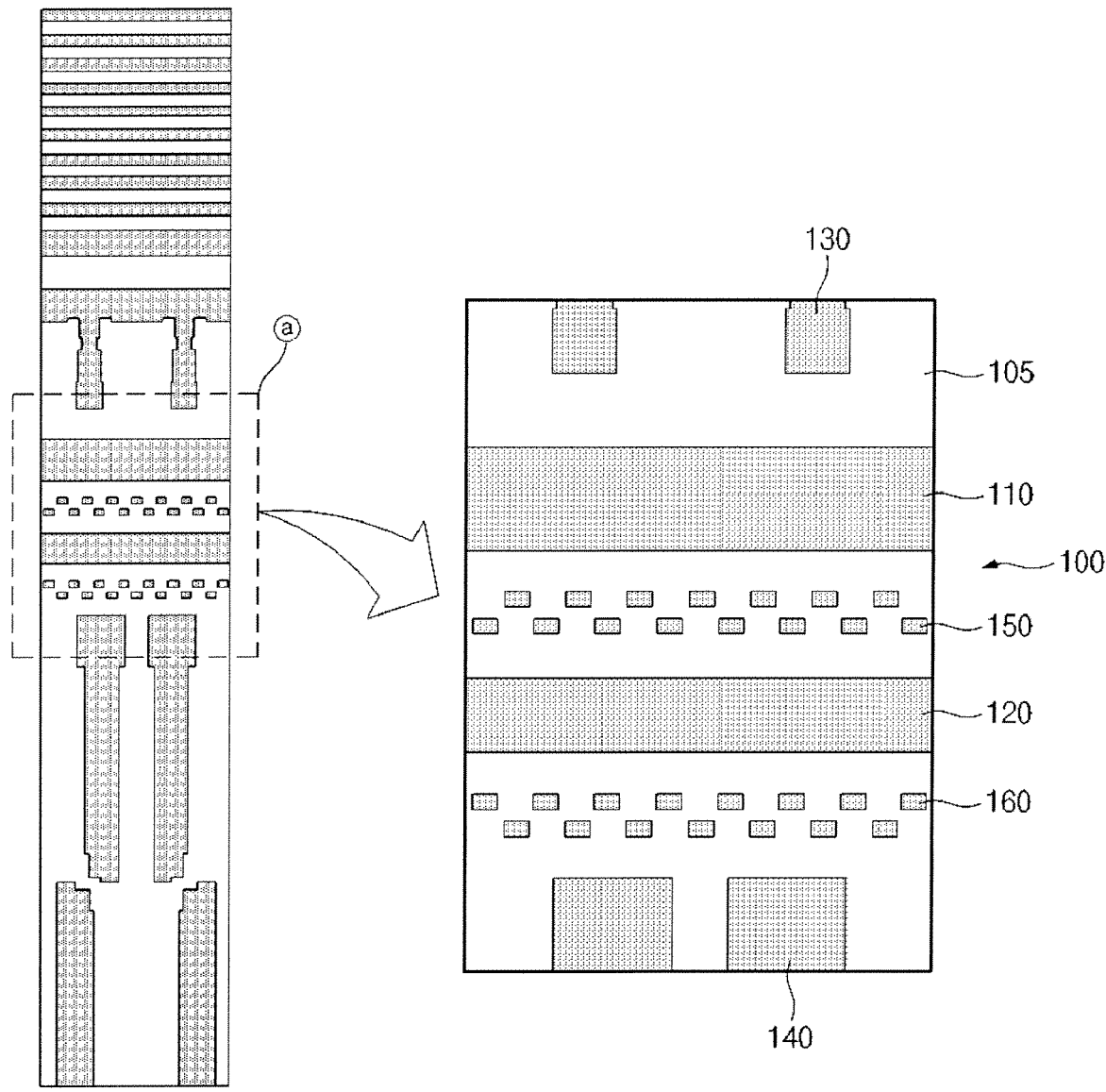
FIG. 4 is a plane view showing an exposure mask according to the invention.
Figure 5:
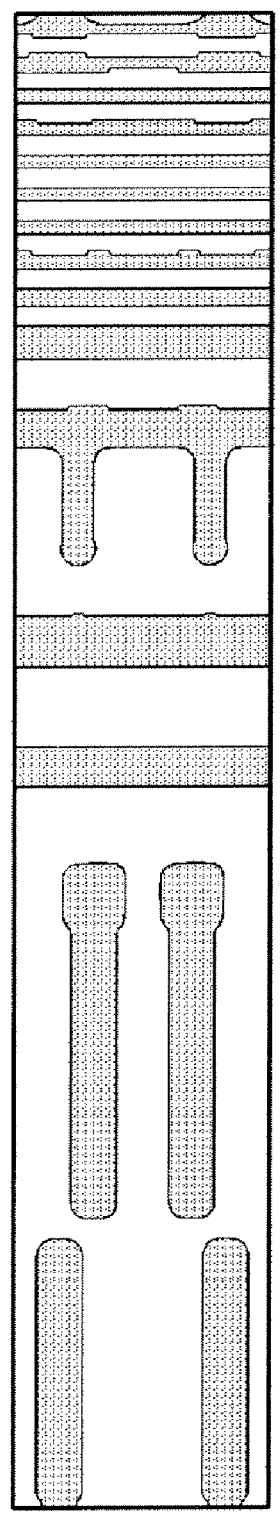
FIG. 5 is the plane view showing the simulation of a pattern to be formed on a semiconductor substrate by a lithography process using the exposure mask of FIG. 4.

Referring to FIG. 4, an exposure mask 100 includes a light blocking pattern formed on a transparent substrate 105. The exposure mask 100 can be, for example, a binary mask or a phase shifting mask.

The light blocking pattern includes a first pattern 110 and a second pattern 120, each pattern having, for example, a line-shape, and formed parallel to each other in the upper portion of the transparent substrate 105. The first and second patterns 110, 120 can both be formed, for example, as an island pattern. Alternatively, for example, the first pattern 110 can be formed as a line pattern, and the second pattern 120 can be formed as an island pattern, or the first pattern 110 can be formed as an island pattern and the second pattern 120 can be formed as a line pattern.

A first neighbor pattern 130 can be formed adjacent to the first pattern 110, and a second neighbor pattern 140 can be formed adjacent to the second pattern 120. The size of a second neighbor pattern 140 is bigger than the size of a first neighbor pattern 130, accordingly the second pattern 120 is formed wider than the first pattern 110.

The light-blocking pattern also includes an assist feature. The assist feature includes a first assist pattern 150 disposed between the first pattern 110 and the second pattern 120. The assist feature can further include a second assist pattern 160 disposed between the second pattern 120 and the second neighbor pattern 140.

The first assist pattern 150 includes a first dot pattern 150a and a second dot pattern 150b, the first dot pattern 150a and the second dot pattern 150b are arranged diagonally each other in two rows. The second assist pattern 160 includes a third dot pattern 160a and the fourth dot pattern 160b, the third dot pattern 160a and the fourth do pattern 160b are arranged diagonally each other in two rows. The arrangement of the assist patterns 150, 160 can improve the depth of focus (DOF) margin during the exposure process. The first assist pattern 150 and the second assist pattern 160 are not transferred onto the semiconductor substrate during the lithographic process.

Figure 6:
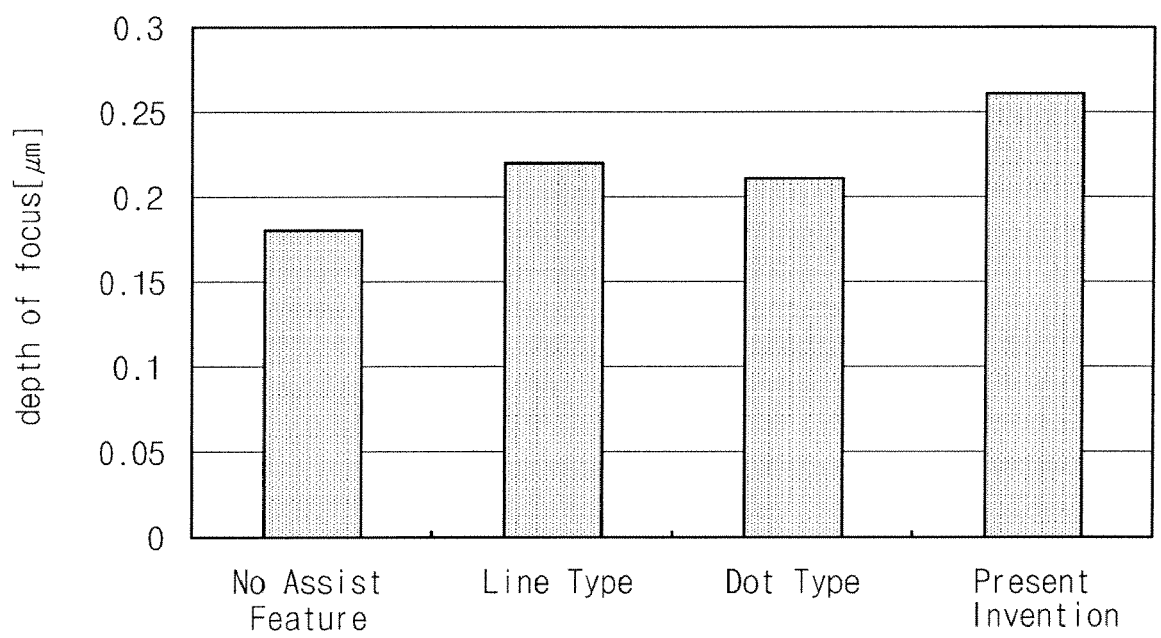
FIG. 6 is a graph showing the depth of focus margin of the invention and of the related art.

Referring to FIG. 6, the depth of focus margin is small when no assist feature is used. FIG. 6 further demonstrates that the first assist pattern 150 and second assist pattern 160 are more effective at improving the depth of focus margin than conventional dot-type and line-type assist features.

A semiconductor device can be formed using the exposure mask 100. An underlying layer is formed on a semiconductor substrate. For example, a hard mask layer and a stack structure that includes an etch mask, or a single structure of the hard mask layer can be formed in the upper portion of the underlying layer.

A photoresist pattern is formed in the upper portion of the underlying layer by performing a lithographic process using the exposure mask 100 as a mask. The lithographic process can be, for example, asymmetry illumination. More specifically, the lithographic process can be, for example, dipole illumination. The photoresist pattern is used to form the first pattern 110, the second pattern 120, the first neighbor pattern 130, and the second neighbor pattern 140. The lithographic process is then performed using.

The underlying layer is etched, using the photoresist pattern as a mask, to form an underlying layer pattern and to expose the semiconductor substrate. The photoresist pattern can then be removed.

The underlying layer pattern can be, for example a line pattern or an island pattern, and can be formed, for example, using a conduction wiring or a pad.

The specific embodiments of the invention have been described for illustrative purposes. It will be apparent to those skilled in the art that various modifications, additions, and substitutes can be made without departing from the spirit or scope of the invention as recited in the appended claims.

What is claimed is:

1. An exposure mask comprising:
   a transparent substrate; and,
   a light blocking pattern comprising a first pattern, a second pattern, and a neighbor pattern;
   an assist feature comprising a first assist pattern disposed between the first pattern and the second pattern, and a second assist pattern disposed between the second pattern and the neighbor pattern;
   wherein the first assist pattern comprises a first dot pattern and a second dot pattern arranged diagonally with respect to each other in two rows; and
   the second assist pattern comprises a third dot pattern and a fourth dot pattern arranged diagonally with respect to each other in two rows.

2. The exposure mask of claim 1, wherein the first pattern has a form selected from the group consisting of a line pattern and an island pattern.

3. The exposure mask of claim 2, wherein the second pattern has a form selected from the group consisting of a line pattern and an island pattern, and the form of the second pattern is different than the form of the first pattern.

4. The exposure mask of claim 2, wherein the second pattern has a form that is the same as the form of the first pattern.

5. The exposure mask of claim 1, wherein the exposure mask is selected from the group consisting of a binary mask and a phase shifting mask.

6. A method of manufacturing a semiconductor device, the method comprising:
   providing an exposure mask comprising a transparent substrate and a light blocking pattern and an assist feature; and,
   forming a photoresist pattern using the exposure mask; wherein
   the light blocking pattern comprises a first pattern, a second pattern, and a second neighboring pattern;
   the assist feature comprises a first assist pattern disposed between the first pattern and the second pattern, and a second assist pattern disposed between the second pattern and the second neighbor pattern;
   the first assist pattern comprises a first dot pattern and the second dot pattern arranged diagonally with respect to each other in two rows; and
   the second assist pattern comprises a third dot pattern and a fourth dot pattern arranged diagonally with respect to each other in two rows.

7. The method of claim 6 wherein the exposure mask is selected from the group consisting of a binary mask and a phase shifting mask.

8. The method of claim 6 further comprising forming the photoresist pattern using asymmetry illumination.

9. The method of claim 6 further comprising removing the photoresist pattern.

* * * * *